US012680193B2

(12) United States Patent
Noguchi

(10) Patent No.: US 12,680,193 B2
(45) Date of Patent: *Jul. 14, 2026

(54) SiC WAFER AND SiC EPITAXIAL WAFER

(71) Applicant: Resonac Corporation, Tokyo (JP)

(72) Inventor: Shunsuke Noguchi, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 19/021,402

(22) Filed: Jan. 15, 2025

(65) Prior Publication Data

US 2025/0154684 A1 May 15, 2025

Related U.S. Application Data

(62) Division of application No. 18/543,359, filed on Dec. 18, 2023, now Pat. No. 12,227,875.

(30) Foreign Application Priority Data

Dec. 20, 2022 (JP) ................................. 2022-203405

(51) Int. Cl.
*B32B 3/02* (2006.01)
*C30B 29/36* (2006.01)
(52) U.S. Cl.
CPC ................ *C30B 29/36* (2013.01); *B32B 3/02* (2013.01)

(58) Field of Classification Search
CPC .................................. C30B 29/36; B32B 3/02
See application file for complete search history.

(56) References Cited

U.S. PATENT DOCUMENTS

| | | | |
|---|---|---|---|
| 11,053,607 | B2 | 7/2021 | Wada et al. |
| 11,530,491 | B2 | 12/2022 | Wada et al. |
| 2024/0200227 | A1 | 6/2024 | Noguchi |

FOREIGN PATENT DOCUMENTS

| | | |
|---|---|---|
| JP | 2015-231950 A | 12/2015 |
| JP | 2022-064015 A | 4/2022 |

*Primary Examiner* — Elizabeth E Mulvaney
(74) *Attorney, Agent, or Firm* — Sughrue Mion, PLLC

(57) ABSTRACT

In a SiC wafer, a crystal surface has an offset angle of 0.5°-10° in a first direction with respect to a surface of the SiC wafer, dislocations are confirmed when a first measurement point is confirmed through X-ray reflection topography using (3-3016) as a diffraction surface, the first measurement point is a point shifted by a length of ½ of a radius of the SiC wafer in the first direction from the center of a measurement region that is 5 mm or more inside from the outer circumferential end of the SiC wafer, the dislocations include first dislocations having an aspect ratio of 5 or more and second dislocations having an aspect ratio of less than 3, where the aspect ratio is obtained by the specific method disclosed, and at the first measurement point, the density of the first dislocations is higher than the density of the second dislocations.

16 Claims, 9 Drawing Sheets

SiC WAFER AND SiC EPITAXIAL WAFER

CROSS REFERENCE TO RELATED APPLICATIONS

This application is a divisional of application Ser. No. 18/543,359 filed Dec. 18, 2023, which claims priority from Japanese Patent Application No. 2022-203405 filed Dec. 20, 2022, the contents of all of which are incorporated herein by reference.

BACKGROUND OF THE INVENTION

Field of the Invention

The present invention relates to a SiC wafer and a SiC epitaxial wafer.

Description of Related Art

Compared to silicon (Si), silicon carbide (SiC) has an insulation breakdown electric field that is one order of magnitude larger and a band gap which is three times thereof. In addition, silicon carbide (SiC) has characteristics such as a thermal conductivity that is about three times that of silicon (Si). Therefore, silicon carbide (SiC) is expected to be able to be applied to power devices, high frequency devices, high temperature operation devices, and the like. Therefore, in recent years, SiC epitaxial wafers have been used for semiconductor devices such as those mentioned above.

A SiC epitaxial wafer is obtained by laminating a SiC epitaxial layer on a surface of a SiC wafer. Hereinafter, a wafer before the SiC epitaxial layer is laminated will be referred to as the SiC wafer, and a wafer after the SiC epitaxial layer is laminated will be referred to as the SiC epitaxial wafer. The SiC wafer is cut out from a SiC ingot.

The SiC wafer has dislocations. Dislocations may become device killer defects that cause fatal defects in SiC devices. For example, a basal plane dislocation (BPD) is one of device killer defects. When a forward current is applied to a bipolar device, stacking faults expand starting from the BPD and become high-resistance stacking faults. High-resistant parts created within the device reduce the reliability of the device. A BPD has a property of expanding while forming stacking faults when minority carriers are recombined in the vicinity thereof.

For example, Patent Document 1 describes a method of producing a silicon carbide single-crystal in which the number of dislocations contained in a SiC wafer can be reduced. In addition, for example, Patent Document 2 describes reducing a dislocation density in parts that have a large effect on the device.

PATENT DOCUMENTS

[Patent Document 1] Japanese Unexamined Patent Application, First Publication No. 2022-64015
[Patent Document 2] Japanese Unexamined Patent Application, First Publication No. 2015-231950

SUMMARY OF THE INVENTION

If the SiC wafer has a larger size, it is more likely to warp. Warpage of the SiC wafer may cause problems such as poor sensor detection and poor suction. In addition, warpage of the SiC epitaxial wafer may have an adverse effect on the process of semiconductor devices.

The present invention has been made in view of the above circumstances, and an object of the present invention is to provide a SiC wafer and a SiC epitaxial wafer that have few adverse effects on devices while reducing warpage of the wafer.

The inventors conducted extensive studies and as a result, found that, although dislocations can cause defects, they also play a role in relaxing stress that causes warping. Therefore, the inventors found that, among dislocations, there are dislocations that greatly contribute to stress relaxation and dislocations that contribute little to stress relaxation. The present disclosure provides the following aspects in order to address the above problems.

(1) In a SiC wafer according to a first aspect, a crystal surface has an offset angle of 0.5° or more and 10° or less in a first direction with respect to a surface of the SiC wafer. In the SiC wafer, when a first measurement point is measured using X-ray reflection topography with (3-3016) as a diffraction surface, dislocations are confirmed. The first measurement point is a point shifted by a length of ½ of a radius of the SiC wafer in the first direction from the center of a measurement region that is 5 mm or more inside from the outer circumferential end of the SiC wafer. The dislocations include first dislocations having an aspect ratio of 5 or more and second dislocations having an aspect ratio of less than 3, where the aspect ratio is obtained by dividing a long axis length of a rectangle that circumscribes the dislocation and has the smallest area by a short axis length. At the first measurement point, the density of the first dislocations is higher than the density of the second dislocations.

(2) In the SiC wafer according to the above aspect, dislocations are confirmed when a second measurement point is measured using X-ray reflection topography with (3-3016) as a diffraction surface. The second measurement point is a point shifted by a length of ½ of a radius of the SiC wafer in a direction opposite to the first direction from the center of the measurement region. The density of the dislocations at the second measurement point may be lower than the density of the dislocations at the first measurement point.

(3) In the SiC wafer according to the above aspect, the dislocations at the second measurement point may include the first dislocations and the second dislocations. At the second measurement point, the density of the second dislocations may be higher than the density of the first dislocations.

(4) In the SiC wafer according to the above aspect, a diameter may be 140 mm or more.

(5) In the SiC wafer according to the above aspect, the diameter may be 190 mm or more.

(6) In the SiC wafer according to the above aspect, when supported on a support surface at a position overlapping a circumference with a radius of 17.5 mm from the center, if a surface connecting first points overlapping the support surface when viewed in a thickness direction within the upper surface is set as a first reference surface, and the direction above the first reference surface is set as positive, a BOW may be 40 μm or less.

(7) In the SiC wafer according to the above aspect, when supported on a support surface at a position overlapping a circumference with a radius of 17.5 mm from the center, if a surface connecting first points overlapping the support surface when viewed in a thickness direction within the upper surface is set as a first reference surface, a WARP may be 100 μm or less.

(8) In a SiC wafer according to a second aspect, when a first measurement point, a second measurement point, a third measurement point and a fourth measurement point are measured using X-ray reflection topography with (3-3016) as a diffraction surface, dislocations are confirmed. The first measurement point is a point shifted by a length of ½ of a radius of the SiC wafer in a first direction from the center of a measurement region that is 5 mm or more inside from the outer circumferential end of the SiC wafer. The second measurement point is a point shifted by a length of ½ of a radius of the SiC wafer in a direction opposite to the first direction from the center of the measurement region. The third measurement point is a point shifted by a length of ½ of a radius of the SiC wafer in a second direction perpendicular to the first direction from the center of a measurement region that is 5 mm or more inside from the outer circumferential end of the SiC wafer. The fourth measurement point is a point shifted by a length of ½ of a radius of the SiC wafer in a direction opposite to the second direction from the center of the measurement region. The dislocations include first dislocations having an aspect ratio of 5 or more and second dislocations having an aspect ratio of less than 3, where the aspect ratio is obtained by dividing a long axis length of a rectangle that circumscribes the dislocation and has the smallest area by a short axis length. At each of the first measurement point, the second measurement point, the third measurement point and the fourth measurement point, the density of the first dislocations is higher than the density of the second dislocations.

(9) A SiC epitaxial wafer according to a third aspect includes the SiC wafer according to the above aspect and a SiC epitaxial layer formed on a surface of the SiC wafer.

The SiC wafer according to the above aspect has less wafer warpage and few adverse effects on devices.

DETAILED DESCRIPTION OF THE INVENTION

Figure 1:
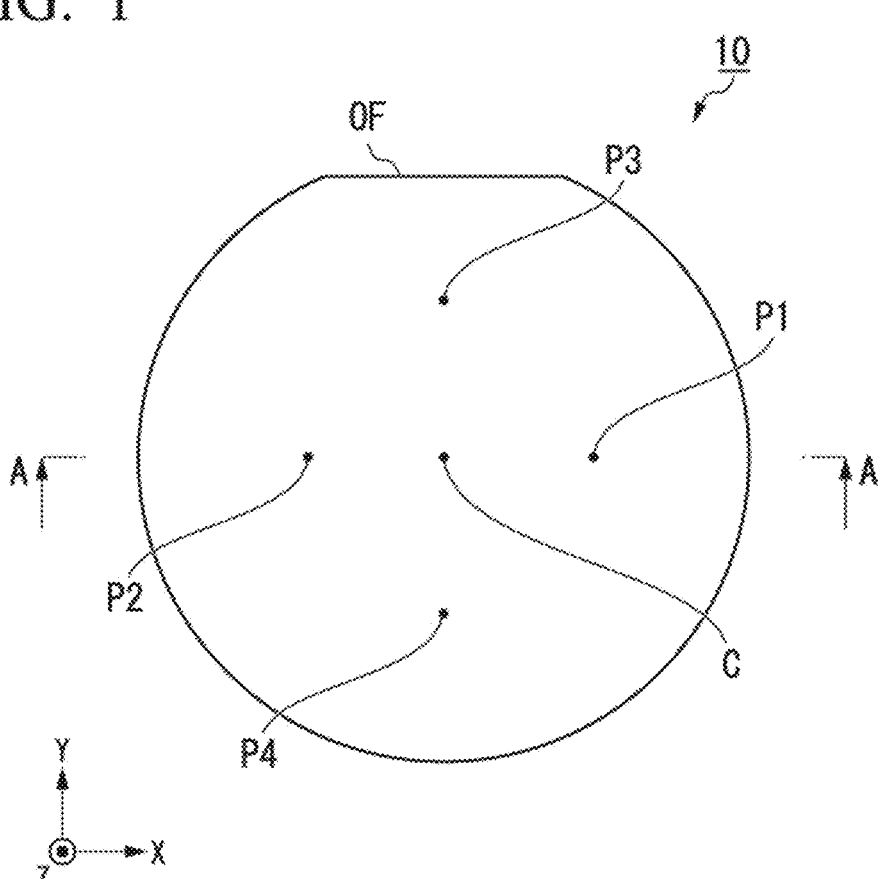
FIG. 1 is a plan view of a SiC wafer according to the present embodiment.

Hereinafter, a SiC wafer according to the present embodiment and the like will be appropriately described in detail with reference to the drawings. In the drawings used in the following description, in order to facilitate understanding of features of the present embodiment, characteristic parts are enlarged for convenience of illustration in some cases, and the dimensional proportions of components may be different from actual components. Materials, sizes and the like exemplified in the following descriptions are examples, the present invention is not limited thereto, and can be appropriately changed and implemented within ranges without changing the scope and spirit of the invention.

First, directions are defined. One direction within the plane in which the SiC wafer spreads is defined as an X direction and a direction perpendicular to the X direction within the same plane is defined as a Y direction. The X direction is, for example, a direction in which the crystal surface $10c$ is inclined at a predetermined offset angle with respect to a first surface $10a$. The X direction is an example of a first direction, and is sometimes referred to as an offset direction. The X direction is, for example, the <11-20> direction. The Y direction is, for example, the <1-100> direction. The Z direction is a direction orthogonal to the SiC wafer and is perpendicular to the X direction and the Y direction.

Figure 2:
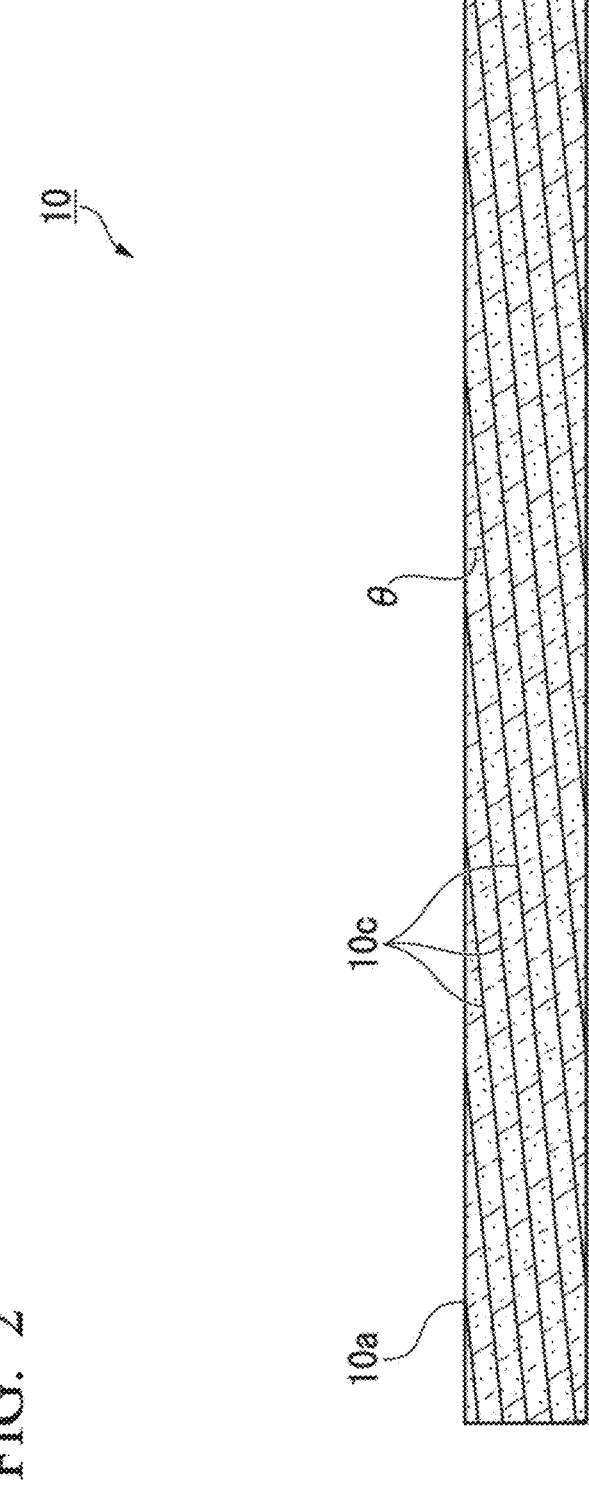
FIG. 2 is a cross-sectional view of the SiC wafer according to the present embodiment.
Figure 2:
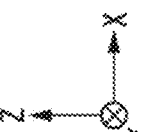

FIG. 1 is a plan view of a SiC wafer 10 according to the present embodiment. FIG. 2 is a cross-sectional view of the SiC wafer 10 according to the present embodiment. FIG. 2 is a cross section taken along the line A-A in FIG. 1 and is an XZ cross section of the SiC wafer 10.

In the SiC wafer 10, a crystal surface $10c$ is inclined with respect to the first surface $10a$, and there is an offset angle θ between the crystal surface $10c$ and the first surface $10a$. The offset angle θ is, for example, 0.5° or more and 10° or less. The SiC wafer 10 is made of SiC. The crystal structure of SiC may be any selected from among 4H, 6H, 3C, and 15R. The SiC wafer 10 may be an n type, p type or semi-insulating wafer.

The shape of the SiC wafer 10 in a plan view is a substantially circular shape. The SiC wafer 10 may have an orientation flat OF or a notch for determining the direction of the crystal axis. The orientation flat OF is, for example, perpendicular to the Y direction.

The diameter of the SiC wafer 10 is not particularly limited. If the SiC wafer 10 has a larger diameter, it is more likely to warp. The diameter of the SiC wafer 10 is, for example, 140 mm or more. The diameter of the SiC wafer 10 may be, for example, 149 mm or more and 151 mm or less. In addition, the diameter of the SiC wafer 10 may be, for example, 190 mm or more and may be 199 mm or more and 201 mm or less. The diameter of the SiC wafer 10 may be, for example, 240 mm or more, 249 mm or more and 251 mm or less, 290 mm or more, or 299 mm or more and 301 mm or less.

The thickness of the SiC wafer 10 is not particularly limited. If the SiC wafer 10 has a thinner thickness, it is more likely to warp. The thickness of the SiC wafer 10 is, for example, 300 μm or more and 650 μm or less. The thickness of the SiC wafer 10 may be, for example, 480 μm or more and 520 μm or less, 390 μm or more and 410 μm or less, or 340 μm or more and 360 μm or less. For example, when the diameter of the SiC wafer 10 is 199 mm or more and 201 mm or less, the thickness of the SiC wafer 10 may be 480 μm or more and 520 μm or less, 390 μm or more and 410 μm or less, or 340 μm or more and 360 μm or less.

The SiC wafer 10 has dislocations therein. Dislocations are parts in which atoms are disorganized inside a crystal. Examples of dislocations include a threading edge dislocation (TED), a threading screw dislocation (TSD), and a basal plane dislocation (BPD). The type of dislocation can be determined using an optical microscope, an electron microscope (SEM) or the like from the shape of etch pitches that appear with molten KOH etching.

When a first measurement point P1 in the SiC wafer 10 is measured, dislocations are confirmed. The first measurement point P1 is a position shifted by a length of ½ of the radius of the SiC wafer 10 in the +X direction from the center C of the measurement region that is 5 mm or more inside from the outer circumferential end of the SiC wafer 10.

The outer circumferential end of the SiC wafer 10 is the outermost circumference of the entire SiC wafer 10 including a bevel (an inclined part of the outer circumferential end). A range of 5 mm from the outer circumferential end of the SiC wafer 10 is outside the device acquisition region, and is outside the measurement region. In the range of 5 mm from the outer circumferential end of the SiC wafer 10, production conditions may be disturbed due to external disturbance and the like, and the dislocation density within the crystal and the like are unstable. The center C is a geometric center of the SiC wafer 10.

The first measurement point P1 is positioned on the offset-downstream side relative to the center C of the measurement region. The offset-upstream side is the side on which step-flow growth starts, and the opposite side thereof, the direction in which step-flow growth progresses, is the offset-downstream side. In FIG. 1, the −X direction corresponds to the offset-upstream side, and the +X direction corresponds to the offset-downstream side. The first measurement point P1 of the SiC wafer 10 is, for example, a square region with one side of 0.25 mm.

The dislocations in the SiC wafer 10 can be measured using X-ray reflection topography with (3-3016) as a diffraction surface. A part in which a difference in intensity with respect to an X-ray diffraction intensity of a dislocation-free part is 5% or more of the intensity of the dislocation-free part is defined as a dislocation. The penetration depth of X-rays is, for example, 150 μm or less. The dislocation density of dislocations in the SiC wafer 10 is, for example, 100/cm² or more and less than 1,000/cm², and may be 1,000/cm² or more and less than 5,000/cm² or may be 5,000/cm² or more and 10,000/cm² or less. The dislocation density can be calculated by counting the number of dislocations and dividing it by the area of the reflection topography image. The dislocation density is determined, for example, by averaging the measurement results at a plurality of measurement points (for example, two measurement points or four measurement points).

Figure 3:
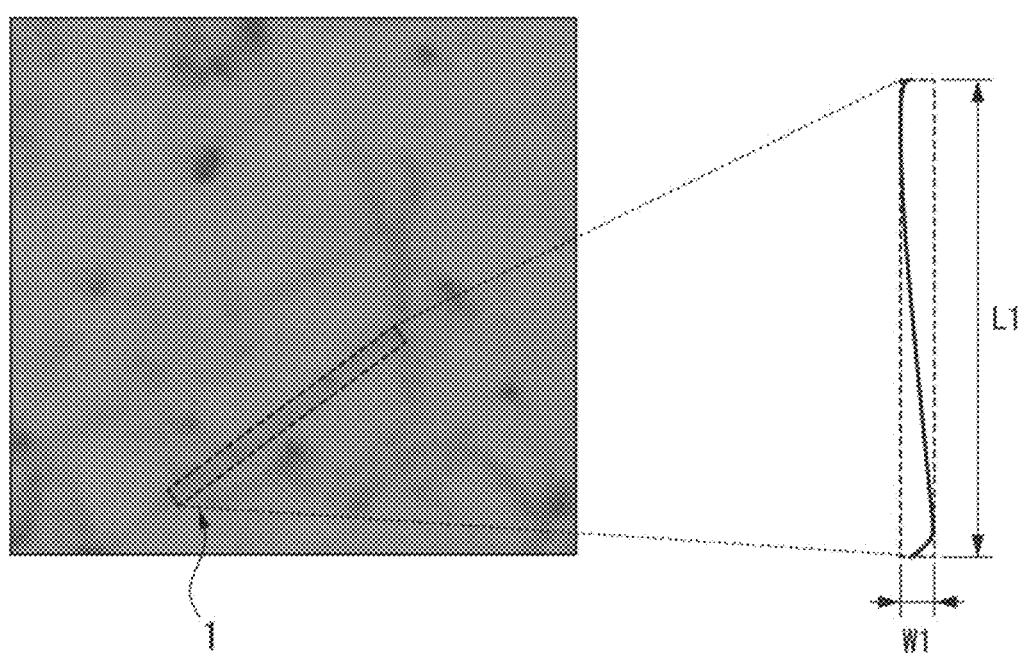
FIG. 3 is an example of a first dislocation of the SiC wafer according to the present embodiment.
Figure 4:
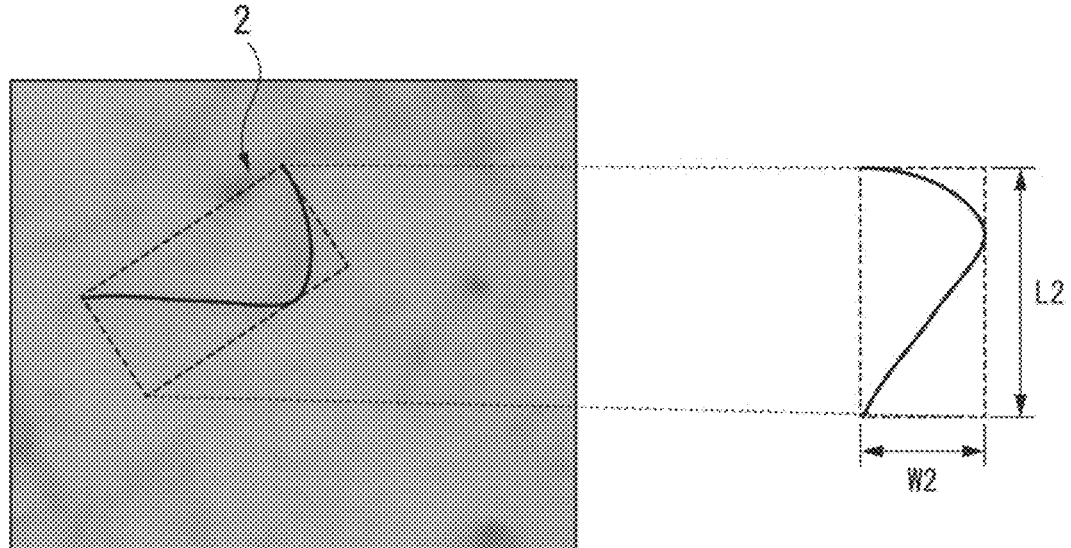
FIG. 4 is an example of a second dislocation of the SiC wafer according to the present embodiment.

The SiC wafer 10 has a first dislocation and a second dislocation. In the reflection topography image of the first measurement point P1, the first dislocation and the second dislocation are confirmed. FIG. 3 is an example of the first dislocation 1 of the SiC wafer according to the present embodiment. FIG. 4 is an example of the second dislocation 2 of the SiC wafer according to the present embodiment.

The first dislocation 1 is a dislocation having an aspect ratio of 5 or more. The aspect ratio of the first dislocation 1 is determined by drawing a rectangle that circumscribes the dislocation and has the smallest area, and dividing a long axis length L1 by a short axis length W1. The first dislocation 1 is, for example, a BPD introduced by slippage of the growth surface.

The second dislocation 2 is a dislocation having an aspect ratio of less than 3. The aspect ratio of the second dislocation 2 is determined by drawing a rectangle that circumscribes the dislocation and has the smallest area, and dividing a long axis length L2 by a short axis length W2. The second dislocation 2 is, for example, a BPD introduced by bending of the dislocation.

At the first measurement point P1, the density of the first dislocations 1 is higher than the density of the second dislocations 2. Like the dislocation density, the density of the first dislocations 1 and the density of the second dislocations 2 can be calculated by counting the number of respective dislocations and dividing it by the area of the reflection topography image. The first dislocation 1 has a higher aspect ratio than the second dislocation 2 and extends in one direction. Therefore, the first dislocation 1 has a greater effect of relaxing stress applied in one direction within the SiC wafer 10 than the second dislocation. When the density of the first dislocations 1 is higher than the density of the second dislocations 2 at the first measurement point P1, the stress generated in the SiC wafer 10 can be relaxed and warpage of the SiC wafer 10 can be reduced.

Dislocations are confirmed when a second measurement point P2 of the SiC wafer 10 is measured. The second measurement point P2 is a position shifted by a length of ½ of the radius of the SiC wafer 10 in the −X direction from the center C of the measurement region that is 5 mm or more inside the outer circumferential end of the SiC wafer 10.

The density of dislocations at the second measurement point P2 is, for example, lower than the density of dislocations at the first measurement point P1. The dislocation density at the second measurement point P2 is, for example, 1,000/cm² or more, and the dislocation density at the first measurement point P1 is, for example, 2,000/cm² or more.

Stress may be more likely to remain on the offset-downstream side of the SiC wafer 10 than the offset-upstream side. This is because, if crystal growth is performed so that the growth surface of the SiC ingot becomes a convex surface, stress is concentrated on the offset-downstream side. The SiC wafer 10 is obtained by cutting out a SiC ingot. If more dislocations are introduced at the first measurement point P1 positioned on the offset-downstream side on which stress is likely to remain than at the second measurement point P2 positioned on the offset-upstream side, the stress in the SiC wafer 10 can be further eliminated. In addition, dislocations on the offset-upstream side may affect the downstream side during crystal growth. If there are fewer dislocations on the offset-upstream side, the quality of the SiC wafer 10 becomes high.

Also in the reflection topography image of the second measurement point P2, a first dislocation and a second dislocation are confirmed. At the second measurement point P2, the density of first dislocations may be higher than the density of second dislocations, and the density of second dislocations may be higher than the density of first dislocations. For example, at the second measurement point P2, the density of second dislocations may be higher than the density of first dislocations. The second dislocations are often taken over and introduced from dislocations of the seed crystal, regardless of growth conditions. On the other hand, the number of first dislocations can be reduced by adjusting growth conditions. For example, the number of first dislocations can be reduced by reducing the temperature gradient of the SiC ingot in the radial direction during growth. If the ratio of the density of second dislocations is relatively higher than the ratio of the density of first dislocations, the total number of dislocations is reduced, and the quality of the SiC wafer 10 becomes higher.

In addition, dislocations are confirmed in the SiC wafer 10 when measured at any position selected from the group consisting of a third measurement point P3, a fourth measurement point P4 and the center C. The third measurement point P3 is a position shifted by a length of ½ of the radius of the SiC wafer 10 in the Y direction from the center C of the measurement region that is 5 mm or more inside from the outer circumferential end of the SiC wafer 10. The fourth measurement point P4 is a position shifted by a length of ½ of the radius of the SiC wafer 10 in the −Y direction from the center C of the measurement region that is 5 mm or more inside from the outer circumferential end of the SiC wafer 10.

In the reflection topography image at any position of the third measurement point P3, the fourth measurement point P4 and the center C, the first dislocation 1 and the second dislocation 2 are confirmed. At each measurement point, it is preferable that the density of the first dislocations 1 be higher than the density of the second dislocations 2. In addition, at any position in the measurement region on the offset-downstream side (+X direction) relative to the center C of the SiC wafer 10, it is preferable that the density of the first dislocations 1 be higher than the density of the second dislocations 2.

When the SiC wafer 10 is supported on a support surface 5 at a position overlapping the circumference with a radius of 17.5 mm from the center C, the BOW is 40 µm or less, the BOW is preferably 20 µm or less, and the BOW is more preferably 10 µm or less. In addition, when the SiC wafer 10 is supported on the support surface 5 at a position overlapping the circumference with a radius of 17.5 mm from the center C, the BOW is preferably −40 µm or more, the BOW is more preferably −20 µm or more, and the BOW is still more preferably −10 µm or more. In addition, when the SiC wafer 10 is supported on the support surface 5 at a position overlapping the circumference with a radius of 17.5 mm from the center C, the BOW is preferably −40 µm or more and 40 µm or less, the BOW is more preferably −20 µm or more and 20 µm or less, and the BOW is still more preferably −10 µm or more and 10 µm or less. When the BOW is within the above range, it is possible to reduce conveyance errors. Examples of conveyance errors include poor sensor detection, poor suction, and contact with other members.

Figure 5:
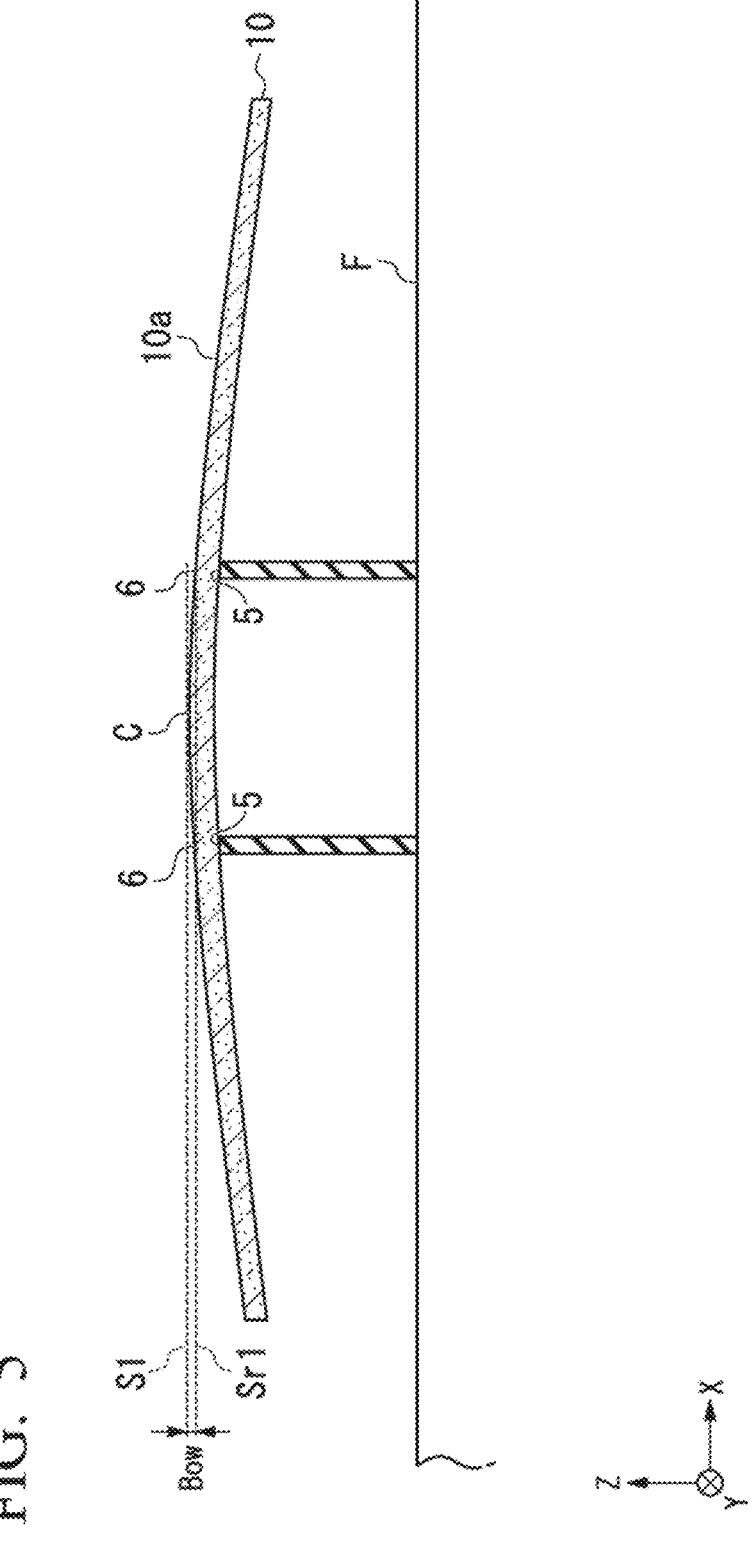
FIG. 5 is a cross-sectional view illustrating a method of evaluating BOW of the SiC wafer according to the present embodiment.

FIG. 5 is a cross-sectional view illustrating a BOW evaluation method when the SiC wafer 10 according to the present embodiment is supported on the support surface 5. As shown in FIG. 5, when the SiC wafer 10 is supported on the support surface 5, the center C of the SiC wafer 10 is positioned farther from a flat surface F than the outermost circumference. The SiC wafer 10 shown in FIG. 5 is bent upward when supported on the support surface 5. The SiC wafer 10 may be bent downward when supported on the support surface 5. In the case of upward bending, the BOW is positive, and in the case of downward bending, the BOW is negative.

The BOW is obtained measuring the height of the center C of the wafer, and this height is defined by a signed distance with respect to the 3-point reference plane. If it is above the 3-point reference plane, it is positive and if it is below the 3-point reference plane, it is negative. The reference plane is referred to as a first reference surface Sr1. The first reference surface Sr1 is a surface connecting first points 6 overlapping the support surface 5 within the first surface 10a when viewed in the thickness direction. The first point 6 is, for example, a part overlapping the support surface 5 when viewed in the thickness direction. If there are a plurality of support surfaces 5, there are a plurality of first points 6. For example, the first reference surface Sr1 is a surface connecting the plurality of first points 6. The BOW is determined as a position of the center C in the first surface 10a in the height direction with respect to the first reference surface Sr1. The absolute value of the BOW is determined as a distance between a first surface S1 which passes through the center C and is parallel to the first reference surface Sr1 (the flat surface F) and the 3-point reference plane (the first reference surface Sr1).

When the SiC wafer 10 according to the present embodiment is supported on the support surface, the WARP is preferably 100 µm or less, the WARP is more preferably 60 µm or less, the WARP is still more preferably 30 µm or less, and the WARP is particularly preferably 20 µm or less.

Figure 6:
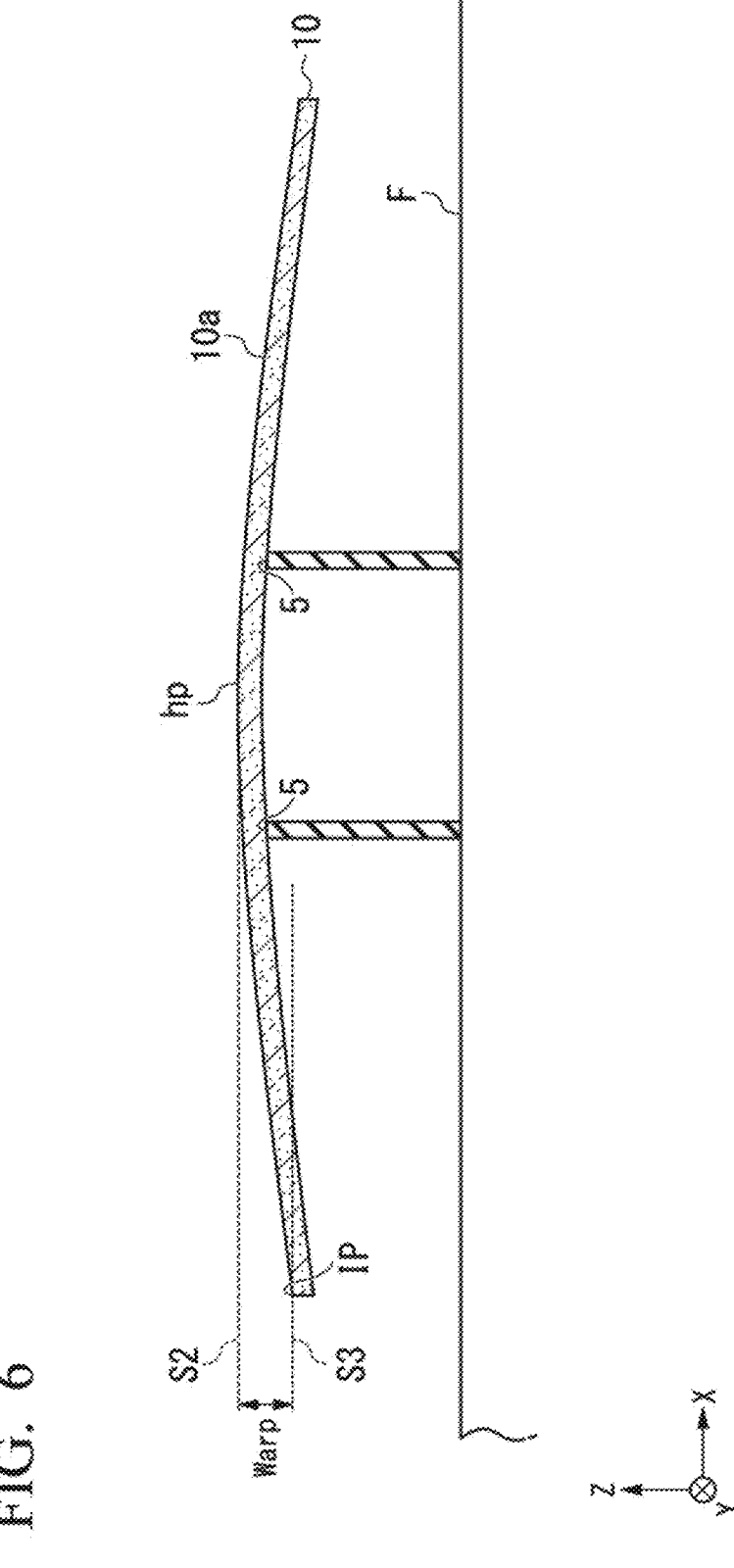
FIG. 6 is a cross-sectional view illustrating a method of evaluating WARP of the SiC wafer according to the present embodiment.

FIG. 6 is a cross-sectional view illustrating a method of evaluating a WARP of the SiC wafer 10 according to the present embodiment.

The WARP is a sum of the distances from the 3-point reference plane to the highest point hp and the lowest point lp of the first surface 10a, and is always a positive value. The WARP is determined as, for example, a distance between a second surface S2 which passes through the highest point hp and is parallel to the 3-point reference plane (the first reference surface Sr1) (the flat surface F) and a third surface S3 which passes through the lowest point lp and is parallel to the 3-point reference plane (the first reference surface Sr1) (the flat surface F). The highest point hp may match the center C, and in this case, the first surface S1 matches the second surface S2. If the WARP is larger, it is determined that the SiC wafer 10 is largely deformed.

Next, a method of producing the SiC wafer 10 will be described. The SiC wafer 10 is obtained by slicing a SiC ingot to a predetermined thickness. For example, the SiC ingot is sliced so that the main surface of the SiC wafer 10 has an offset angle of 0.5° or more and 10° or less with respect to the (0001) plane.

Figure 7:
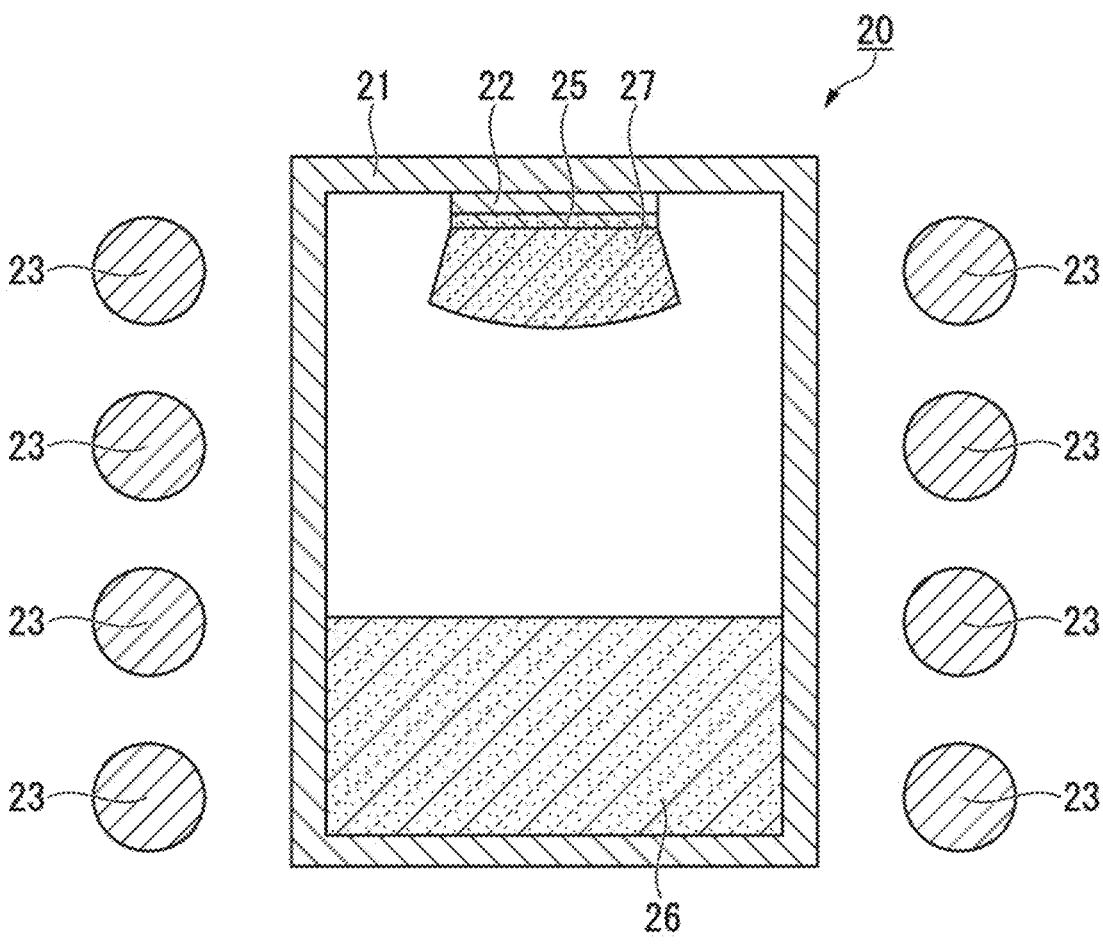
FIG. 7 is an example of a production device used for a SiC ingot sublimation method.

The SiC ingot is produced by, for example, a sublimation method. FIG. 7 is an example of a production device used for a SiC ingot sublimation method. A production device 20 includes a crucible 21, a pedestal 22 and a heater 23. A seed crystal 25 is attached to the pedestal 22, and a raw material 26 is arranged at a position facing the seed crystal 25 in the crucible 21. A SiC ingot 27 is crystal-grown on the seed crystal 25. The SiC ingot 27 is obtained by recrystallizing a SiC gas sublimed from the raw material 26 on the surface of the seed crystal 25.

In the seed crystal 25, a seed crystal whose crystal lattice has a curvature radius of 130 m or more is used. The seed crystal 25 whose crystal lattice has a curvature radius of a predetermined value or more has a small lattice warpage. Therefore, if the seed crystal 25 whose crystal lattice has a curvature radius of a predetermined value or more is used, the basal plane dislocation due to warpage of lattices of the seed crystal is less likely to be introduced during crystal growth. Since the second dislocation is often caused by warpage of lattices of the seed crystal, the first dislocation is relatively easily introduced into the SiC ingot 27 that has crystal-grown from the seed crystal 25.

When the SiC ingot 27 is produced, the temperature of the raw material 26 is, for example, 2,000° C. or higher and 2,500° C. or lower, and the temperature of the seed crystal 25 is, for example, 1,900° C. or higher and 2,400° C. or lower. In addition, the SiC ingot 27 is crystal-grown so that the temperature of the film-formation surface of the SiC ingot 27 satisfies the relationship of the following Formula (1). The temperature of the SiC ingot 27 can be adjusted by adjusting the arrangement, output and the like of the heater 23.

$$(\text{"end average temperature"} - \text{"growth}\tag{1}$$

$$\text{surface center temperature"})/\text{"crystal radius"} > 0.7° \text{ C./cm}$$

"End average temperature" is the average temperature of the outer circumference when the growth surface of the SiC ingot 27 is seen in a plan view. "Growth surface center temperature" is the temperature at the center when the growth surface of the SiC ingot 27 is seen in a plan view.

When the relationship of Formula (1) is satisfied, the crystal growth rate differs between the center and the outer circumferential end of the growth surface of the SiC ingot. As a result, the first dislocation 1 can be introduced into the SiC ingot 27 more selectively than the second dislocation 2.

During crystal growth of the SiC ingot 27, the crucible 21 may be rotated at a speed of 0.1 rpm or more and 10 rpm or less. The inside of the crucible 21 is filled with an inert gas such as He and Ar. The pressure in the crucible 21 is, for example, 0.1 torr or more and 100 torr or less.

In addition, after the SiC ingot 27 is produced, the SiC ingot 27 is annealed. Annealing is performed so that the maximum temperature is 1,500° C. or higher. Annealing is performed by creating a temperature gradient of the SiC ingot 27 in the radial direction. The temperature gradient of the SiC ingot 27 in the radial direction on the offset-upstream side is made to be less than 0.7° C./cm, and the temperature gradient of the SiC ingot 27 in the radial direction on the offset-downstream side is made to be 0.7° C./cm or more. Annealing is performed for, for example, 30 minutes or longer. If annealing is performed under the above conditions, the first dislocations 1 can be introduced into the SiC ingot 27 more selectively than the second dislocations 2.

Next, the produced SiC ingot 27 is sliced, the surface thereof is polished by, for example, chemical mechanical polishing (CMP), and thus the SiC wafer 10 is obtained. Regarding the surface roughness of the SiC wafer 10, for example, it is preferable that the root mean square roughness (RMS) be less than 1 nm. If the SiC ingot 27 is produced under the above conditions, the density of the first dislocations 1 at a first measurement point p1 of the SiC wafer 10 is higher than the density of the second dislocations 2.

As described above, the SiC wafer 10 according to the present embodiment is less likely to warp. This is because dislocations, which are conventionally required to be reduced because they cause defects, are intentionally introduced into the SiC wafer 10. In addition, when the dislocation introduced into the SiC wafer 10 is set as the first dislocation 1, the stress applied to the SiC wafer 10 can be more effectively relaxed.

While preferable embodiments of the present invention have been described above in detail, the present invention is not limited to these specific embodiments, and various modifications and alternations can be made in a range within the spirit and scope of the present invention described in the scope of the claims.

Figure 8:
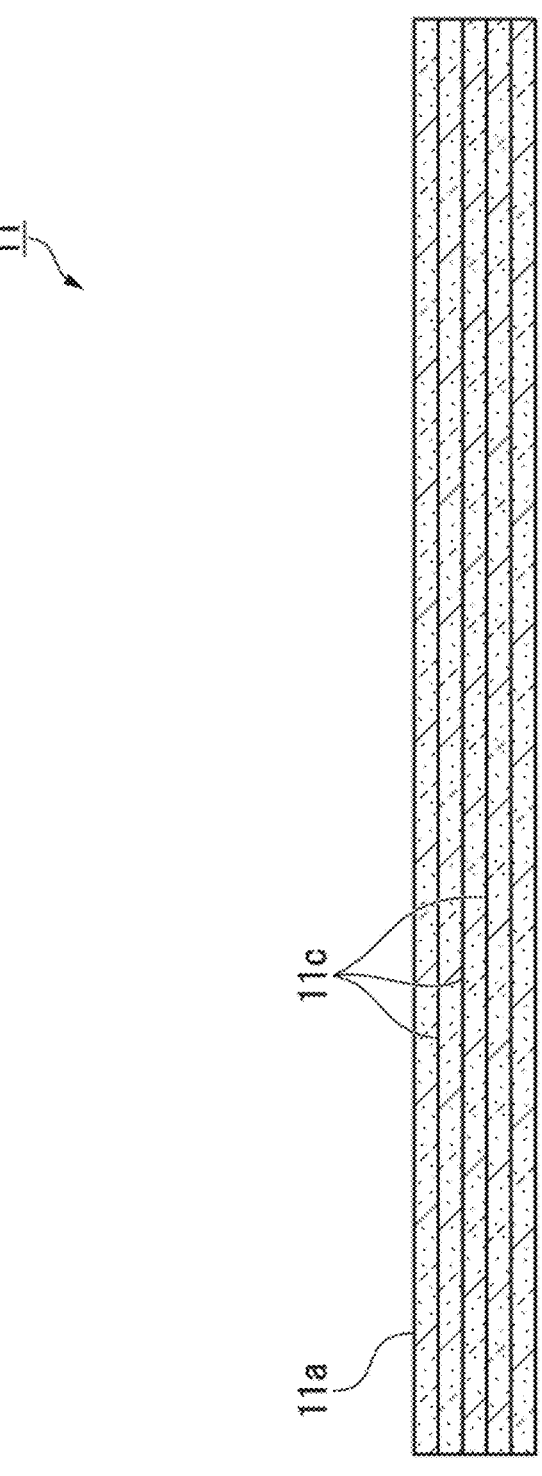
FIG. 8 is a cross-sectional view of a SiC wafer according to a first modification example.
Figure 8:
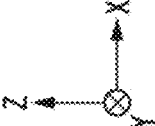

FIG. 8 is a cross-sectional view of a SiC wafer 11 according to a first modification example. The plan view of the SiC wafer 11 is the same as the plan view of the SiC wafer 10 shown in FIG. 1.

In the SiC wafer 11, a crystal surface 11c is not inclined with respect to a first surface 11a. The offset angle θ between the crystal surface 11c and the first surface 11a is 0°. Here, the offset angle is not limited to strictly 0°. If the offset angle θ is less than 0.1°, the offset angle θ is almost equivalent to 0°, and the offset angle θ may be less than 0.1°. The SiC wafer 11 is the same as the SiC wafer 10 except that the crystal surface 11c does not have an offset angle θ.

The SiC wafer 11 has dislocations therein. The SiC wafer 11 has first dislocations 1 and second dislocations 2. In the SiC wafer 11, at each of the first measurement point P1, the second measurement point P2, the third measurement point P3 and the fourth measurement point P4, the density of the first dislocations 1 is higher than the density of the second dislocations 2. When the center C of the SiC wafer 11 is measured using X-ray reflection topography with (3-3016) as a diffraction surface, dislocations are confirmed. Like the SiC wafer 10, the SiC wafer 11 according to the first modification example is less likely to warp.

In the case of the SiC wafer 11 in FIG. 8, the center C is positioned on the offset-upstream side, and the offset becomes more downstream from the center C toward the outer circumference side. Therefore, the first measurement point P1, the second measurement point P2, the third measurement point P3 and the fourth measurement point P4 are positioned offset-downstream from the center C.

The SiC wafer 11 is obtained by slicing a SiC ingot. During crystal growth of the SiC ingot from which the SiC wafer 11 is cut out, the crystal central part is positioned on the offset-upstream side, and the point shifted by ½ of a radius from the crystal central part is positioned on the offset-downstream side from the crystal central part. Therefore, like a first embodiment, crystal growth of the SiC ingot is performed by creating a temperature gradient between the offset-upstream side and the offset-downstream side.

In a growth device shown in FIG. 7, the temperature gradient can be realized by installing a disk-shaped insulation member at a position facing the seed crystal 25. When the disk-shaped insulation material is installed at a position facing the seed crystal 25, it is possible to create a partially flat temperature distribution. For example, when the position and size of the insulation material are adjusted, the temperature gradient in the vicinity of the center of the SiC ingot 27 in the radial direction can be made to be less than 0.7° C./cm, and the temperature gradient in the radial direction at a point shifted by ½ of a radius from the crystal central part positioned on the offset-downstream side in the SiC ingot 27 can be made to be 0.7° C./cm or more.

The diameter of the insulation member may be, for example, ½ of the diameter of the seed crystal 25, and the distance between the insulation material and the seed crystal 25 may be, for example, 80 mm. In addition, after the growth, when annealing is performed with the above configuration (a predetermined insulation material is arranged at a predetermined position), the temperature gradient in the vicinity of the center of the SiC ingot in the radial direction is made to be less than 0.7° C./cm, and the temperature gradient in the radial direction at a point shifted by ½ of a radius from the crystal central part positioned on the offset-downstream side of the SiC ingot 27 can be made to be 0.7° C./cm or more. When the SiC ingot from which the SiC wafer 11 is cut out is produced under the above conditions, the density of the first dislocations 1 in the SiC wafer 11 at each of a first measurement point p1, a second measurement point p2, a third measurement point p3, and a fourth measurement point p4 is higher than the density of the second dislocations 2.

For example, the dislocation density at the center C of the SiC wafer 11 is lower than the dislocation density at the first measurement point P1, the second measurement point P2, the third measurement point P3 and the fourth measurement point P4. The dislocation density at the center C is, for example, 1,000/cm² or more, and the dislocation density at the first measurement point P1, the second measurement point P2, the third measurement point P3 and the fourth measurement point P4 is, for example, 2,000/cm² or more.

At the center C of the SiC wafer 11, the density of first dislocations may be higher than the density of second dislocations, and the density of second dislocations may be higher than the density of first dislocations. For example, the density of second dislocations at the center C of the SiC wafer 11 is higher than the density of first dislocations.

Figure 9:
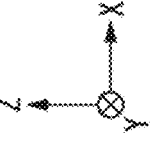
FIG. 9 is a cross-sectional view of a SiC epitaxial wafer according to the present embodiment.

In addition, FIG. 9 is a cross-sectional view of a SiC epitaxial wafer 30 according to the present embodiment. The SiC epitaxial wafer 30 has a SiC wafer 10 and a SiC epitaxial layer 15. The SiC epitaxial wafer 30 can be produced by forming the SiC epitaxial layer 15 on the first surface 10a of the SiC wafer 10. The diameter of the SiC epitaxial wafer 30 is approximately the same as the diameter of the SiC wafer 10.

The SiC epitaxial wafer 30 can be used for SiC devices. Examples of SiC devices include diodes, Schottky barrier diodes (SBD), field effect transistors (FET), insulated-gate field-effect transistors (MOSFET), junction field effect transistors (JFET), and metal-semiconductor field-effect transistors (MESFET). In addition, the SiC device can be used as power conditioners for LEDs, automobiles, trains and the like.

Figure 10:
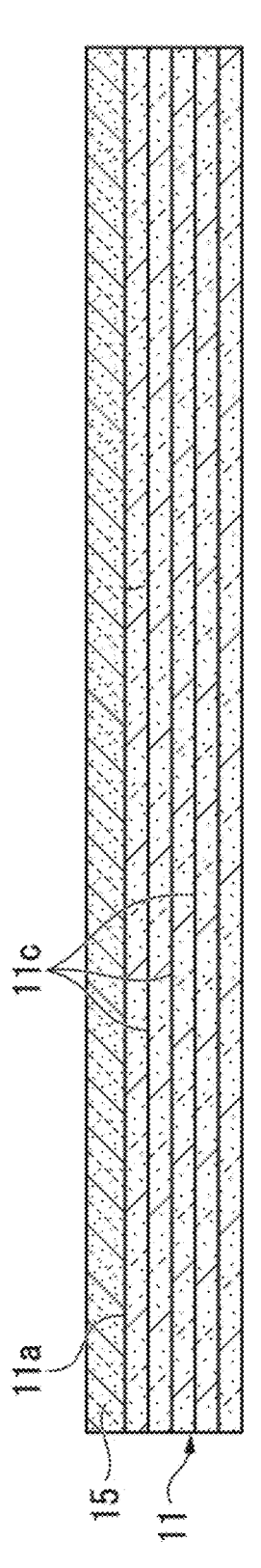
FIG. 10 is a cross-sectional view of a SiC epitaxial wafer according to the first modification example.
Figure 10:
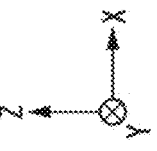

Here, as an example, the SiC epitaxial wafer 30 having the SiC epitaxial layer 15 on the SiC wafer 10 is shown, but as shown in FIG. 10, a SiC epitaxial wafer 31 may have the SiC epitaxial layer 15 on the SiC wafer 11.

While preferable embodiments of the present invention have been described above in detail, the present invention is not limited to these specific embodiments, and various modifications and alternations can be made in a range within the spirit and scope of the present invention described in the scope of the claims.

EXAMPLES

Example 1

First, a SiC ingot was produced by a sublimation method. As the seed crystal, one having a crystal lattice with a curvature radius of 130 m or more was used, and one having a crystal growth surface having an offset angle of 4° with respect to the (0001) plane was used. In Example 1, the SiC ingot was grown so that the temperature of the growth surface of the SiC ingot satisfied Formula (1). Specifically, the SiC ingot was grown so that ("end average temperature"–"growth surface center temperature")/"crystal radius"=1.1° C./cm. The end average temperature was an average temperature of four ends. The first end of four measurement points was the end of the growth surface that was in the offset-downstream direction from the center of the growth surface. The other three ends were located at positions rotated 90 degrees, 180 degrees, and 270 degrees around the center from the first end. The growth surface center and four ends in which the end average temperature was measured were positioned at the same height, and the temperature was determined.

Next, the produced SiC ingot was annealed. The temperature gradient on the offset-upstream side of the SiC ingot in the radial direction was 0.5° C./cm, and the temperature gradient on the offset-downstream side of the SiC ingot in the radial direction was 1.5° C./cm. The temperature gradient on the offset-upstream side of the SiC ingot in the radial direction was obtained by dividing the difference between the upstream end temperature of the SiC ingot in the offset-upstream direction from the center and the center temperature by the crystal radius of the SiC ingot. The temperature gradient on the offset-downstream side of the SiC ingot in the radial direction was obtained by dividing the difference between the downstream end temperature of the SiC ingot in the offset-downstream direction from the center and the center temperature by the crystal radius of the SiC ingot.

The produced SiC ingot was sliced to a thickness of 600 μm, and the surface thereof was polished by CMP to produce a SiC wafer of Example 1 so that the finish thickness was 500 μm±20 μm. The thickness of the SiC wafer was 500 μm. The diameter of the SiC wafer was 200 mm. The dislocation densities of the SiC wafer at the first measurement point and the second measurement point were determined. In addition, the Bow and Warp of the SiC wafer of Example 1 were measured.

Next, the SiC wafer of Example 1 was conveyed through a predetermined conveyance path, and the conveyance error rate was determined. The height of the conveyance path was 2 mm, and the thickness of the conveyance robot was 1.5 mm. The conveyance stroke width was 50 μm. The conveyance stroke width was a width of movement of the SiC wafer in the vertical direction perpendicular to the conveyance direction when the SiC wafer was raised and conveyed. The wafer of Example 1 had a conveyance error rate of 0%.

Examples 2 to 4

Examples 2 to 4 differed from Example 1 in that temperature conditions during growth of the SiC ingot and the temperature conditions during annealing were changed. The other conditions were the same as in Example 1, and the same evaluation was performed.

Comparative Example 1

Comparative Example 1 differed from Example 1 in that temperature conditions during growth of the SiC ingot and the temperature conditions during annealing were changed. The other conditions were the same as in Example 1, and the same evaluation was performed.

Comparative Examples 2 and 3

Comparative Examples 2 and 3 differed from Example 1 in that a seed crystal whose crystal lattice has a curvature radius of 130 m or more was not used, temperature conditions during growth of the SiC ingot were changed, and the SiC ingot was not annealed. The other conditions were the same as in Example 1, and the same evaluation was performed.

Growth conditions and annealing conditions for the SiC ingots of Examples 1 to 4 and Comparative Examples 1 to 3 are summarized in the following Table 1. In Table 1, the growth temperature gradient was determined by ("end average temperature"–"growth surface center temperature")/"crystal radius," the upstream temperature gradient was determined by ("upstream end temperature"–"center temperature")/"crystal radius," and the downstream temperature gradient was determined by ("downstream end temperature"–"center temperature")/"crystal radius."

TABLE 1

| | Growth condition | | Annealing condition | |
|---|---|---|---|---|
| | growth temperature gradient (° C./cm) | with or without | upstream temperature gradient (° C./cm) | downstream temperature gradient (° C./cm) |
| Example 1 | 1.1 | with | 0.5 | 1.5 |
| Example 2 | 1 | with | 0.5 | 1.4 |
| Example 3 | 0.9 | with | 0.6 | 1.3 |
| Example 4 | 0.8 | with | 0.6 | 1.2 |
| Comparative Example 1 | 0.6 | with | 0.6 | 0.6 |
| Comparative Example 2 | 0.5 | without | — | — |
| Comparative Example 3 | 0.3 | without | — | — |

In addition, the evaluation results of Examples 1 to 4 and Comparative Examples 1 to 3 are summarized in the following Table 2. The ratio in Table 2 is a ratio between the first dislocation density and the second dislocation density, and is expressed as "first dislocation density": "second dislocation density."

TABLE 2

| | First measurement point | | | | |
|---|---|---|---|---|---|
| | Average dislocation density | first dislocation density | second dislocation density | ratio | total dislocation density |
| Example 1 | 6030 | 3800 | 1100 | 3.4:1 | 7300 |
| Example 2 | 5955 | 2972 | 1025 | 2.9:1 | 6800 |
| Example 3 | 6035 | 2247 | 1070 | 2.1:1 | 7100 |
| Example 4 | 6395 | 2040 | 1134 | 1.8:1 | 7523 |
| Comparative Example 1 | 5963 | 1148 | 1640 | 0.7:1 | 5500 |
| Comparative Example 2 | 6101 | 1124 | 1784 | 0.6:1 | 5712 |
| Comparative Example 3 | 6234 | 899 | 1652 | 0.5:1 | 5493 |

| | Second measurement point | | | | | | |
|---|---|---|---|---|---|---|---|
| | first dislocation density | second dislocation density | ratio | total dislocation density | Bow (μm) | Warp (μm) | Conveyance error rate (%) |
| Example 1 | 1489 | 1584 | 0.9:1 | 4760 | 20 | 75 | 0 |
| Example 2 | 1445 | 1700 | 0.9:1 | 5110 | 25 | 85 | 0 |
| Example 3 | 1372 | 1653 | 0.8:1 | 4970 | 30 | 95 | 5 |
| Example 4 | 1331 | 1752 | 0.8:1 | 5266 | 35 | 99 | 12 |
| Comparative Example 1 | 1351 | 1876 | 0.7:1 | 6426 | 70 | 115 | 78 |
| Comparative Example 2 | 1365 | 2094 | 0.7:1 | 6489 | 80 | 125 | 95 |
| Comparative Example 3 | 1325 | 2500 | 0.5:1 | 6975 | 90 | 135 | 100 |

In Examples 1 to 4, the density of first dislocations at first measurement point was higher than the density of second dislocations, and the conveyance error rate was low. On the other hand, in Comparative Examples 1 to 3, the density of first dislocations at the first measurement point was lower than the density of second dislocations, and the conveyance error rate was high. This is thought to have been caused by the fact that, in Examples 1 to 4, warpage of the SiC wafer was reduced due to the first dislocation. Reduction of warpage of the SiC wafer of Examples 1 to 4 was confirmed from the fact that the Bow and Warp of Examples 1 to 4 were smaller than the Bow and Warp of Comparative Examples 1 to 3.

EXPLANATION OF REFERENCES

1 First dislocation
2 Second dislocation
5 Support surface
6 First point
10, 11 SiC wafer
15 SiC epitaxial layer
20 Production device
21 Crucible
22 Pedestal
23 Heater
25 Seed crystal
26 Raw material
27 SiC ingot
P1 First measurement point
P2 Second measurement point
P3 Third measurement point
P4 Fourth measurement point
C Center
10a, 11a First surface
10c, 11c Crystal surface

What is claimed is:

1. A SiC crystal in which a crystal surface has an offset angle of 0.5° or more and 10° or less in a first direction with respect to a surface of the SiC crystal, and dislocations are confirmed when a first measurement point is measured using X-ray reflection topography with (3-3016) as a diffraction surface, wherein the first measurement point is a point shifted by a length of ½ of a radius of the SiC crystal in the first direction from the center of a measurement region that is 5 mm or more inside from the outer circumferential end of the SiC crystal, wherein the dislocations include first dislocations having an aspect ratio of 5 or more and second dislocations having an aspect ratio of less than 3, where the aspect ratio is obtained by dividing a long axis length of a rectangle that circumscribes the dislocation and has the smallest area by a short axis length, and wherein, at the first measurement point, the density of the first dislocations is higher than the density of the second dislocations.

2. The SiC crystal according to claim 1, wherein dislocations are confirmed when a second measurement point is measured using X-ray reflection topography with (3-3016) as a diffraction surface, wherein the second measurement point is a point shifted by a length of ½ of a radius of the SiC crystal in a direction opposite to the first direction from the center of the measurement region, and wherein the density of the dislocations at the second measurement point is lower than the density of the dislocations at the first measurement point.

3. The SiC crystal according to claim 2, wherein the dislocations at the second measurement point include the first dislocations and the second dislocations, and wherein, at the second measurement point, the density of the second dislocations is higher than the density of the first dislocations.

4. The SiC crystal according to claim 1, wherein the SiC crystal has a diameter of 140 mm or more.

5. The SiC crystal according to claim 1, wherein the SiC crystal has a diameter of 190 mm or more.

6. The SiC crystal according to claim 1, wherein the SiC crystal has a diameter of 240 mm or more.

7. The SiC crystal according to claim 1, wherein the SiC crystal has a diameter of 290 mm or more.

8. A SiC crystal in which, when a first measurement point, a second measurement point, a third measurement point and a fourth measurement point are measured using X-ray reflection topography with (3-3016) as a diffraction surface, dislocations are confirmed, wherein the first measurement point is a point shifted by a length of ½ of a radius of the SiC crystal in a first direction from the center of a measurement region that is 5 mm or more inside from the outer circumferential end of the SiC crystal, wherein the second measurement point is a point shifted by a length of ½ of a radius of the SiC crystal in a direction opposite to the first direction from the center of the measurement region, wherein the third measurement point is a point shifted by a length of ½ of a radius of the SiC crystal in a second direction perpendicular to the first direction from the center of a measurement region that is 5 mm or more inside from the outer circumferential end of the SiC crystal, wherein the fourth measurement point is a point shifted by a length of ½ of a radius of the SiC crystal in a direction opposite to the second direction from the center of the measurement region, wherein the dislocations include first dislocations having an aspect ratio of 5 or more and second dislocations having an aspect ratio of less than 3, where the aspect ratio is obtained by dividing a long axis length of a rectangle that circumscribes the dislocation and has the smallest area by a short axis length, and wherein, at each of the first measurement point, the second measurement point, the third measurement point and the fourth measurement point, the density of the first dislocations is higher than the density of the second dislocations.

9. The SiC crystal according to claim 1,
wherein the SiC crystal is an ingot.
10. The SiC crystal according to claim 2,
wherein the SiC crystal is an ingot.
11. The SiC crystal according to claim 3,
wherein the SiC crystal is an ingot.
12. The SiC crystal according to claim 4,
wherein the SiC crystal is an ingot.
13. The SiC crystal according to claim 5,
wherein the SiC crystal is an ingot.
14. The SiC crystal according to claim 6,
wherein the SiC crystal is an ingot.
15. The SiC crystal according to claim 7,
wherein the SiC crystal is an ingot.
16. The SiC crystal according to claim 8,
wherein the SiC crystal is an ingot.

* * * * *